United States Patent
Amparan et al.

(10) Patent No.: US 6,846,992 B2
(45) Date of Patent: Jan. 25, 2005

(54) POWER PLANE SPLITTING USING A CONTOUR METHOD

(75) Inventors: Alfonso Benjamin Amparan, Fort Collins, CO (US); David Gines, Fort Collins, CO (US); Kevin Lee Wible, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 50 days.

(21) Appl. No.: 10/453,302

(22) Filed: Jun. 3, 2003

(65) Prior Publication Data

US 2004/0245011 A1 Dec. 9, 2004

(51) Int. Cl.[7] .............................. H05K 1/00; H02M 1/00
(52) U.S. Cl. ....................................... 174/250; 363/144
(58) Field of Search ................................. 363/144, 147; 174/250, 253, 254, 255, 260, 261, 268

(56) References Cited

U.S. PATENT DOCUMENTS 4,809,356 A * 2/1989 Peckham et al. ............. 455/86
6,489,748 B1 * 12/2002 Okamura ..................... 320/116
6,596,948 B1 * 7/2003 Haden et al. ................ 174/262

* cited by examiner

Primary Examiner—Matthew V. Nguyen (57) ABSTRACT

A method for power plane splitting. The method enables the traces on a power plane to be organized so that the conductor area is expanded while still ensuring that components with similar power supply requirements are coupled to the same trace. A potential field of a power plane of a printed circuit board is calculated by assigning one or more potential values to one or more components coupled to the printed circuit board and solving for a plurality of potential field values at a plurality of locations between the one or more components. One or more boundaries between the one or more components are defined by selecting contours of constant potential within the calculated potential field. One or more traces on the power plane are created using the one or more boundaries, wherein the one or more traces connect a corresponding one or more pluralities of components and each plurality of components of the one or more.

35 Claims, 9 Drawing Sheets

POWER PLANE SPLITTING USING A CONTOUR METHOD

TECHNICAL FIELD

This invention relates generally to the field of electronic devices and systems, and more specifically to circuit board technology.

BACKGROUND

The power plane of a circuit board can accommodate several voltage sources, which supply power to the elements of the circuit board. The power plane may be constructed by dividing a large conductor into several distinct, non-shorting regions, where each region connects a specific voltage source to components of the board. Unfortunately, a given voltage source may provide power to many locations on the board. This makes power plane design difficult. Manually determining a good choice of the non-shorting regions is time-consuming, and can be error prone. Distinct conductors on a power plane are also referred to as power nets. If there are any shorted nets on the PCB power layer, then the board is useless and must be scrapped.

Automated trace routing is another well-known method for connecting nodes in a circuit board with electrical conductors or traces. This method does not attempt to create traces with a large conductor area. On a power plane, where electrical current is high, however, a large conductor area is desirable or necessary, so as to reduce power loss.

SUMMARY

A method for power plane splitting. The method calculates a potential field of a power plane of a printed circuit board by assigning potential values to components coupled to the printed circuit board and solving for potential field values at locations between the components. The potential field is used in defining boundaries between the components by selecting contours of constant potential within the calculated potential field. The boundaries are used to create traces on the power plane. The traces connect the components so that each component with a same potential value is coupled to a same power supply.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Figure 1:
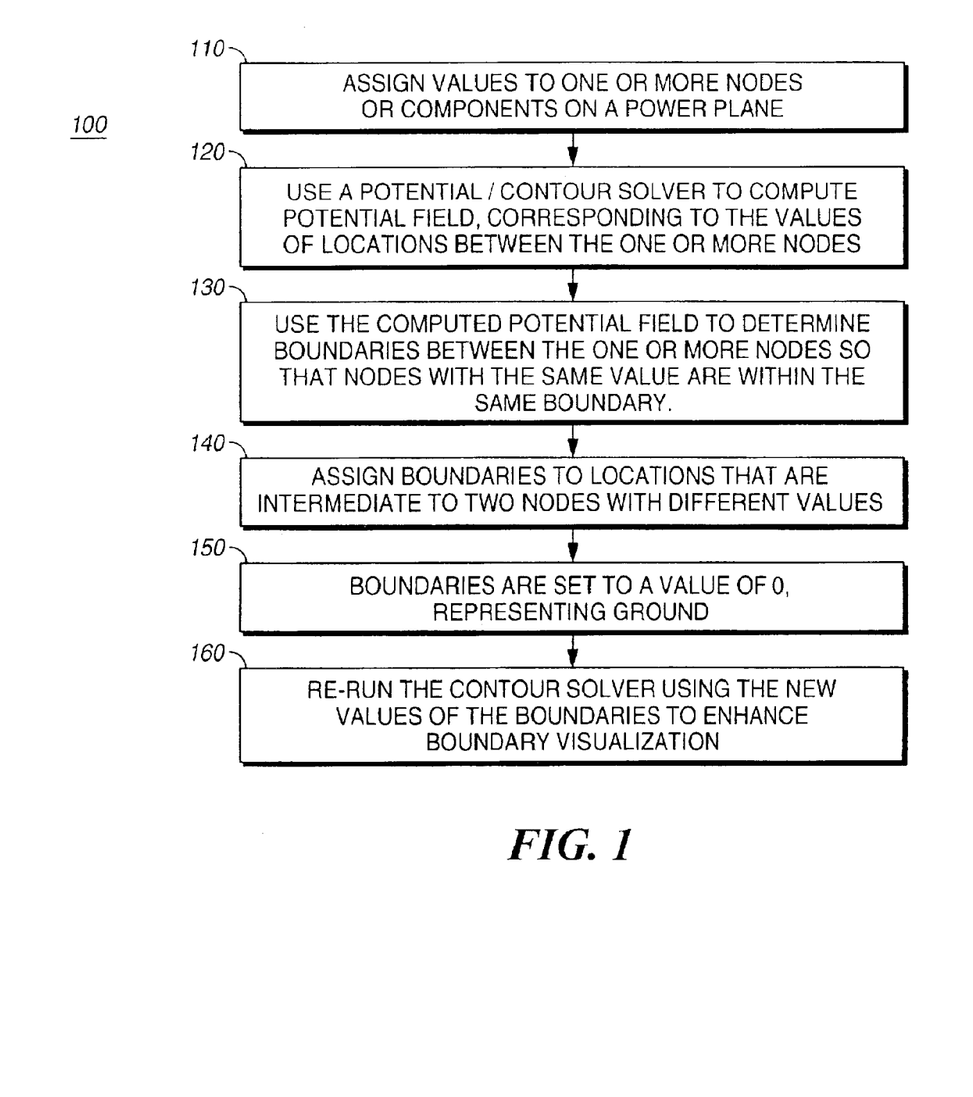
FIG. 1 is a flow diagram of a first method for power plane splitting, according to certain embodiments of the present invention.

Referring now to FIG. 1, a flow diagram of a first method 100 for power plane splitting is shown, according to certain embodiments of the present invention. A power plane that is coupled to one or more components may be split into one or more regions, where each region of the one or more regions is selected to couple a supply voltage to a subset of the one or more components. This power plane splitting, may be accomplished by first assigning potential values to the one or more components, hereinafter referred to as one or more nodes (block 110). Note that these potential values are not necessarily the same as the potential values the nodes will have during operation, but are chosen for simulation and illustrative purposes. A potential field solver may then be used to compute a first potential field at a first one or more locations between the one or more nodes (block 120). The first potential field may then be further processed using a contour solver in order to create one or more boundaries between the one or more nodes so that the one or more regions are created (block 130). It is noted that the first method may be performed in an automated fashion without user interaction, or may be performed in a sequence of semi-automated steps wherein a user verifies an outcome of each step in the sequence in order to create the one or more boundaries.

Thus, the one or more boundaries serve to partition the power plane into the one or more regions, where a particular region of the one or more regions is operable to provide all components within that particular region with a common supply voltage. In certain embodiments of the present invention, one or more areas corresponding to the one or more regions should be expanded by the placement of the one or more boundaries. It is noted that expanding the one or more areas is operable to increase a current-carrying capacity on a conductor of each region of the one or more regions. In certain embodiments of the present invention, each boundary of the one or more boundaries is created by placing the boundary at a plurality of intermediate values between one or more nodes of the one or more nodes (block 140). The one or more boundaries so created may then be assigned a potential value of zero (block 150), and the contour solver may then be re-run in order to more accurately define a location of the one or more boundaries (block 160). It is noted than in certain embodiments of the present invention, the contour solver may be run multiple times in order to provide a more accurate location for the one or more boundaries. Additionally, a user may use the location of the one or more boundaries as an aid in determining where to manually place one or more traces corresponding to the one or more regions.

Figure 3:
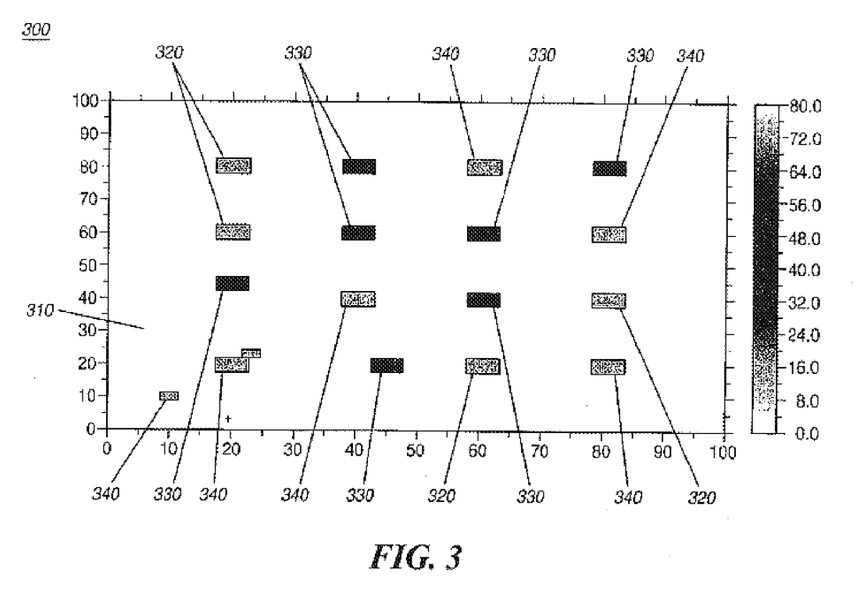
FIG. 3 is a sample grid layout prior to applying the first method for power plane splitting, according to certain embodiments of the present invention.

An example of the first method is shown in FIG. 3–FIG. 7. Referring now to FIG. 3, a sample grid layout 300 prior to applying the first method for power plane splitting is shown, according to certain embodiments of the present invention. The sample grid layout 300 illustrates a nodes (320, 330, 340), wherein the nodes (320, 330, 340) correspond to three distinct power supply levels. In this example, the nodes (320, 330, 340) are randomly assigned to one of the three distinct power supply levels. A first nodes 320 corresponds to a first power supply level, a second nodes 330 corresponds to a second power supply level, and a third nodes 340 corresponds to a third power supply level. As illustrated in FIG. 3, each of first nodes 320, second nodes 330, and third nodes 340 correspond to multiple nodes. The nodes (320, 330, 340) are graphically shown in FIG. 3 on contour plot 310. It is noted that although no connections between nodes (320, 330, 340) are shown in FIG. 3, one of skill in the art will recognize that one or more of the nodes (320, 330, 340) could be initially connected by one or more traces without departing from the spirit and scope of the present invention. It is further noted that the use of three distinct power levels and 17 nodes is exemplary and should not limit the scope of the application.

Figure 4:
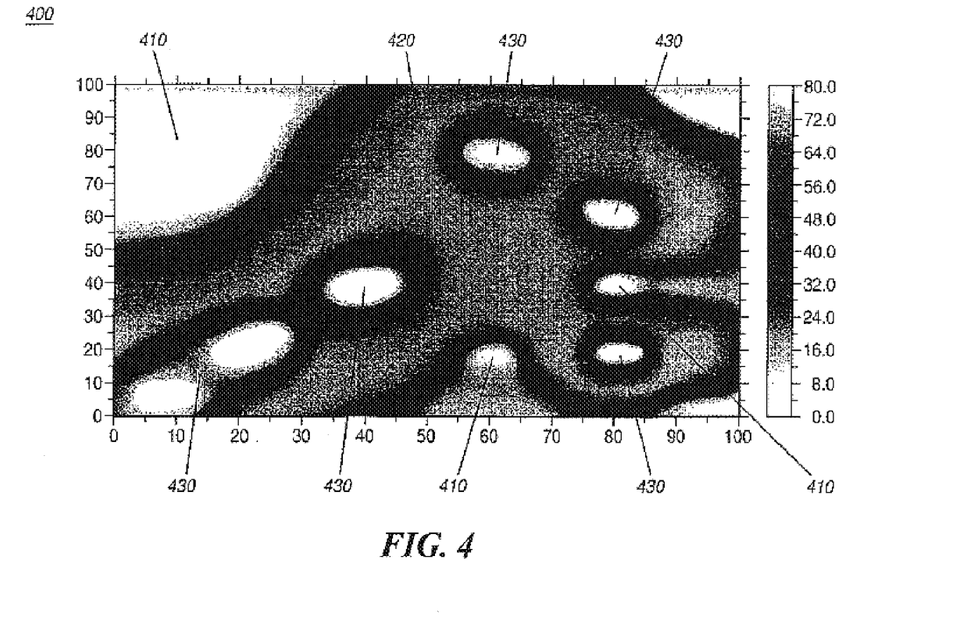
FIG. 4 is a sample grid layout after applying a contour solver of the first method for power plane splitting, according to certain embodiments of the present invention.

Referring now to FIG. 4, the sample grid layout 300 after applying a contour solver of the first method 400 for power plane splitting is shown, according to certain embodiments of the present invention. After applying the contour solver to compute the first potential field of the sample grid layout 300, it is evident in FIG. 4 that the distinct nodes (320, 330, 340) have started to become organized according to the power supply level of the nodes (320, 330, 340). A first region 410 corresponds to nodes 320, a second region 420 corresponds to the second nodes 330, and a third region 430 corresponds to the third nodes 340.

Figure 5:
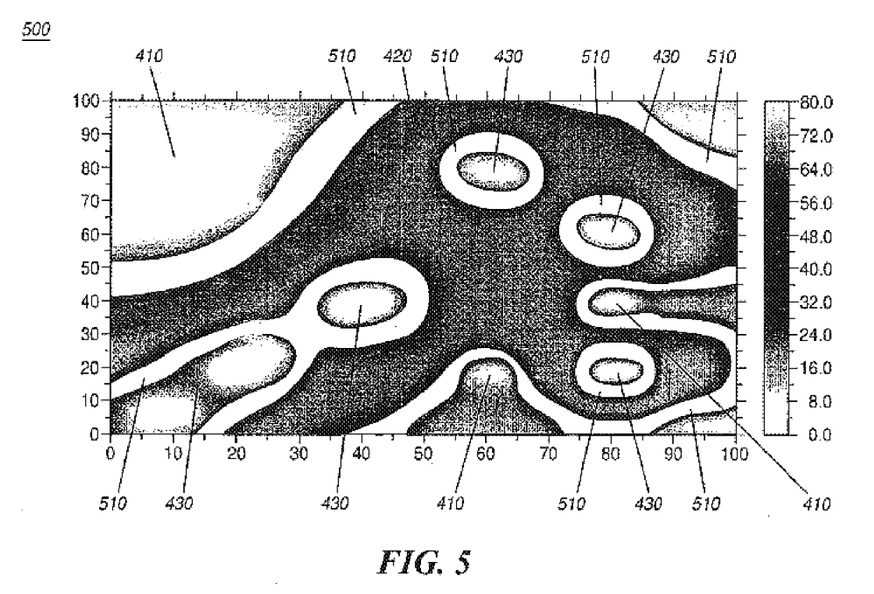
FIG. 5 is a sample grid layout after defining boundaries using the first method for power plane splitting, according to certain embodiments of the present invention.

Referring now to FIG. 5, the sample grid layout 300 after defining one or more boundaries using the first method 500 for power plane splitting is shown, according to certain embodiments of the present invention. In this exemplary embodiment, the one or more boundaries are defined along equi-potential surfaces between the nodes (320, 330, 340). As a numerical example, if the first nodes 320 is assigned a voltage of 50 V, and the second nodes 330 has a voltage of 80 V, a boundary could be defined along the equi-potential surface with a value 60 V. In a certain embodiment of the present invention, the one or more boundaries are located midway between any two nodes of the nodes (320, 330, 340). It is observed that a comparison of FIG. 5 with the nodes (320, 330, 340) shows that regions 410, 420, and 430 now have boundaries 510.

Figure 6:
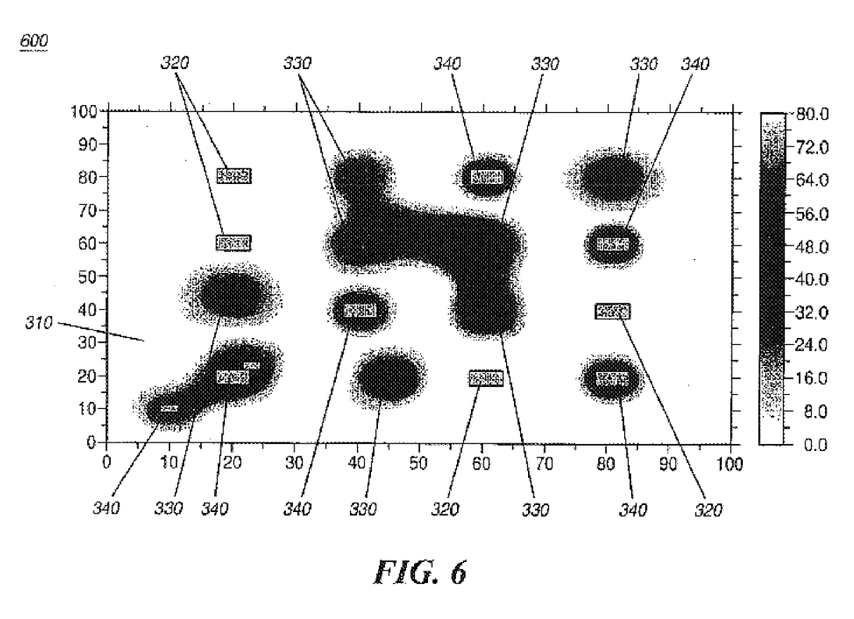
FIG. 6 is a sample grid layout after re-applying the contour solver of the first method for power plane splitting, according to certain embodiments of the present invention.

Referring now to FIG. 6, the sample grid layout 300 after re-applying the contour solver of the first method 600 for power plane splitting is shown, according to certain embodiments of the present invention. The one or more boundaries previously defined in FIG. 5 are used as initial conditions by setting the one or more boundaries to a common value. In certain embodiments of the present invention, the common value is zero volts. The contour solver is then re-run using the nodes (320, 330, 340) and the one or more (grounded) boundaries as initial conditions. This re-application of the contour solver has shown that one problem of a boundary extending to an edge of the power plane can be adequately addressed by using the one or more boundaries as initial conditions. It is also noted that the contour solver has enlarged a corresponding area (region 410, 420, 430) of each of the nodes (320, 330, 340) while at the same time preventing a short from occurring between any of the nodes. The sample grid layout 300 after re-applying the contour solver of the first method 600 can, in a certain embodiment of the present invention, be used to manually define a location of the one or more traces corresponding to the one or more boundaries where the one or more traces connect the nodes (320, 330, 340).

Figure 7:
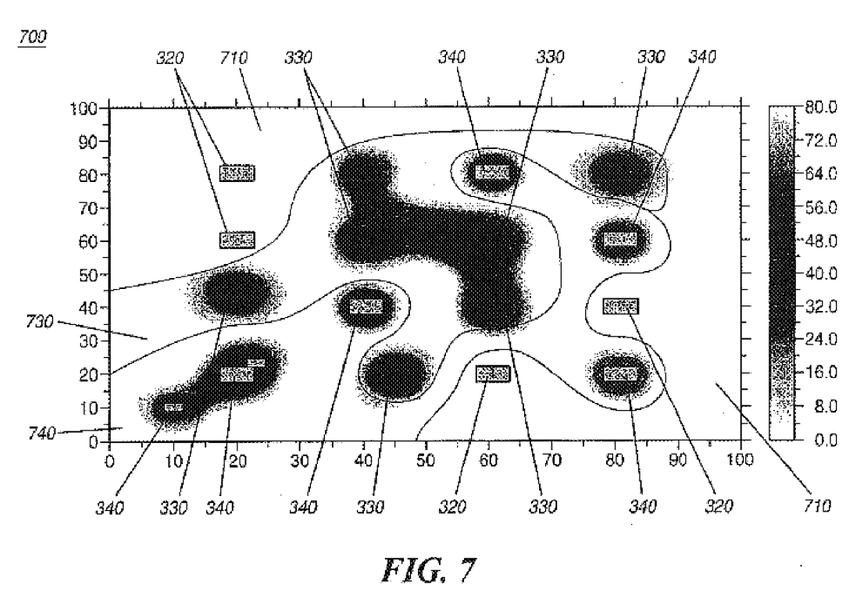
FIG. 7 is a suggested splitting of the power plane after applying the first method for power plane splitting, according to certain embodiments of the present invention.

Referring now to FIG. 7, a suggested splitting of the power plane after applying the first method 700 for power plane splitting is shown, according to certain embodiments of the present invention. FIG. 7 illustrates that the one or more boundaries have been used to create three regions. Region 710 comprises the nodes 320, region 720 comprises the nodes 330, and region 730 comprises the nodes 340. It is observed that in comparison to the regions (410, 420, 430) shown in FIG. 4, regions 710, 720, and 730 clearly define the one or more boundaries needed to connect the nodes (320, 330, 340) and the one or more boundaries shown in FIG. 7 do not extend to the edge of the power plane. The one or more boundaries of FIG. 7 illustrate two features of a splitting of a power plane: Nodes coupled to a same power supply are within a single boundary, and nodes coupled to different power supplies are not coupled together.

Figure 2:
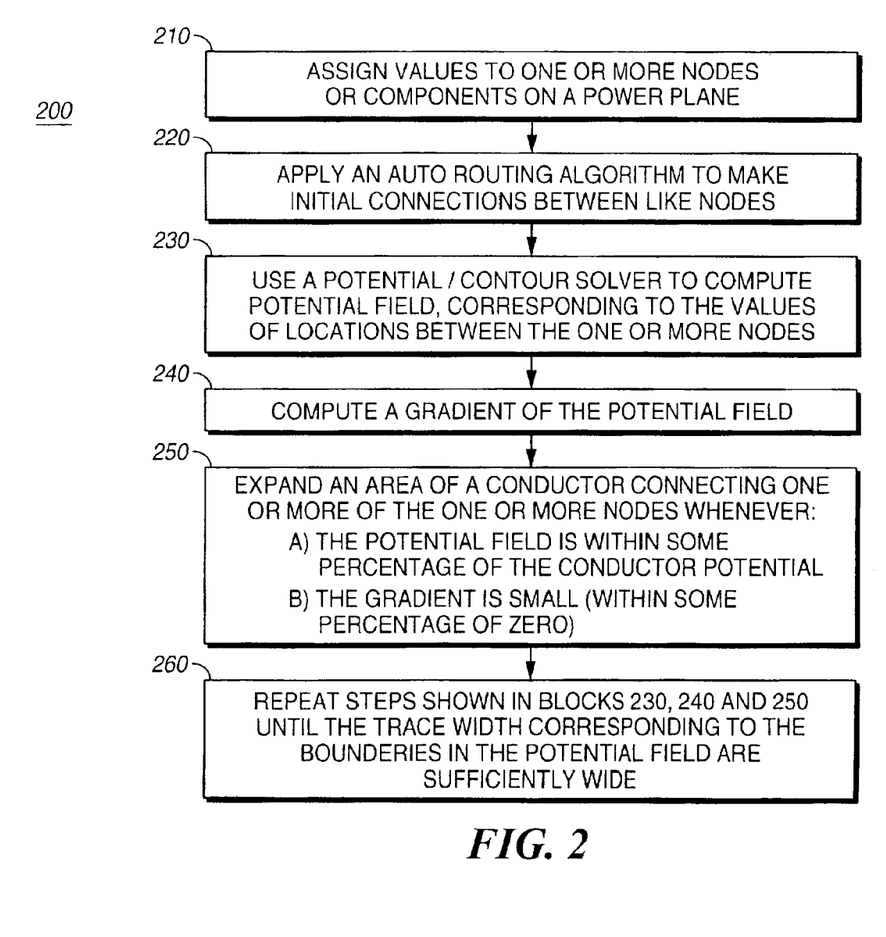
FIG. 2 is a flow diagram of a second method for power plane splitting, according to certain embodiments of the present invention.

Referring now to FIG. 2, a flow diagram of a second method 200 for power plane splitting is shown, according to certain embodiments of the present invention. As in the first method, values are assigned to one or more locations, corresponding to a second one or more nodes, of the power plane (block 210). An auto-routing program is then used to make an initial set of connections between the second one or more nodes (block 220). This initial set of connections is operable to be used to more accurately refine one or more traces, wherein the one or more traces interconnects the second one or more nodes so that each node coupled to a certain trace of the one or more traces has a same supply voltage requirement as any other node coupled to the certain trace of the one or more traces. An important characteristic of a trace is trace width. The second method may be used to maximize trace widths of conductor areas without allowing shorting between adjacent traces.

After running the auto-routing program, virtual potentials are assigned to each of the independent nodes and connecting traces, as before. Again, these potentials are used for simulation, and do not necessarily correspond to the potentials required during operation of the PCB. A potential solver is used to compute a second potential field at a second one or more locations between the second one or more nodes (block 230). Next, a gradient of the second potential field is computed (block 240). The gradient and the second potential field may then be used to expand an area of a conductor connecting one or more of the second one or more nodes while preventing a short from occurring between one or more of the second one or more nodes (block 250). In certain embodiments of the present invention, the conductor area may be expanded where both of the following occur:

1. The second potential field is within a specified percentage of the conductor potential.
2. The value of the gradient is within a specified percentage of zero.

The process of computing the second potential field, the gradient field, and expanding the area of a conductor (blocks 230, 240, 250) may be repeated until the one or more traces corresponding to a second one or more boundaries of the power plane are sufficiently wide.

A common value for the potential tolerance is 20% of the difference to the nearest node potential, so that the area may be expanded when the potential is within 20% of the conductor potential. A greater value of the conductor potential tolerance allows a trace to get wider, more quickly. A common value for the gradient tolerance is 100 $\Delta V$ Volts/mil, where $\Delta V$ is the difference between the assigned potentials of two adjacent nodes, so that the area may be expanded when the gradient is less than this threshold. This threshold corresponds to a minimum node separation of 10 thousandths of an inch common industry clearance between different conductive regions on a power plane. It is noted that these gradient tolerance and potential tolerance are partially driven by the current state of the art in printed circuit board technology. The above stated gradient tolerance and potential tolerance values may be adjusted as PCB technology changes. Note that by making the gradient threshold larger, different conductors are allowed to come closer together—a smaller gradient threshold inhibits different conductors from coming together. These parameters allow the operator to adjust widths according to their preference.

Figure 8:
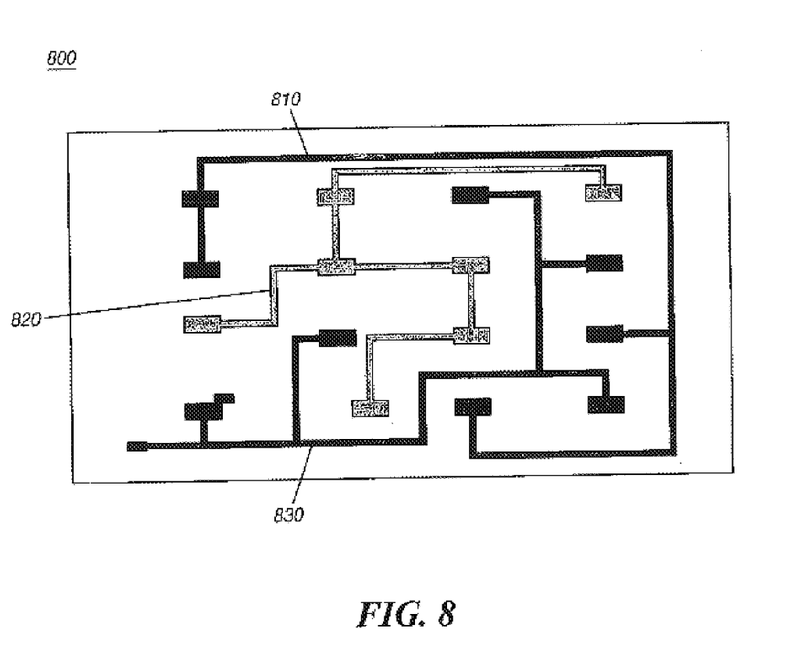
FIG. 8 is a sample grid layout after applying an auto routing application of the second method for power plane splitting, according to certain embodiments of the present invention.

Referring now to FIG. 8, a sample grid layout after applying an auto routing application of the second method 800 for power plane splitting is shown, according to certain embodiments of the present invention. The sample grid layout illustrates the second one or more nodes that have been coupled into three groupings of nodes. A first nodes 810 are connected using an auto-routing program. Similarly, a second nodes 820 and a third nodes 830 are correspondingly coupled. The auto-router program may be used when there is some initial information on requirements for connecting the second one or more nodes. The method illustrated in FIG. 2 may then be used to optimize three conductor areas corresponding to the first nodes 810, second nodes 820, and third nodes 830.

Figure 9:
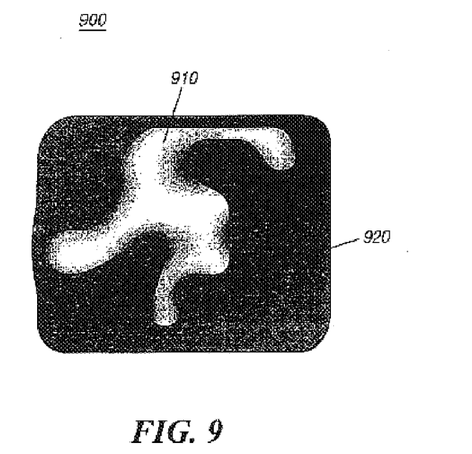
FIG. 9 is a sample grid layout after applying a contour solver of the second method for power plane splitting, according to certain embodiments of the present invention.

Referring now to FIG. 9, the sample grid layout after applying a potential solver of the second method 900 for power plane splitting is shown, where the second nodes 820 has been assigned a potential of 2 volts, the first 810 and third 830 nodes have an assigned potential of 1 volt, and the edges have an assigned potential of 0 volts, in accordance with certain embodiments of the present invention. From the sample grid layout after applying the potential solver of the second method 900, which illustrates a first region 920 surrounding the first nodes 810 and the third nodes 830 and a second region 910 surrounding the second nodes, it is noted that a trace connecting the second nodes 820 can be expanded without causing any of the second nodes 820 to be shorted to a node of the first nodes 810 or a node of the third nodes 830.

The extent to which the traces of the second nodes 820 are expanded depends upon the potential and gradient thresholds, as specified by the user. For this example, the potential threshold was 1.6 volts, and the gradient threshold was set at 1 Volt/unit length. The potential threshold allows the traces of 820 to expand wherever the voltage is greater than 1.6 volts, as long as the gradient is less than 1. By not expanding where the gradient exceeds threshold, we maintain a minimum separation between nodes of 2 unit lengths on the graph.

Figure 10:
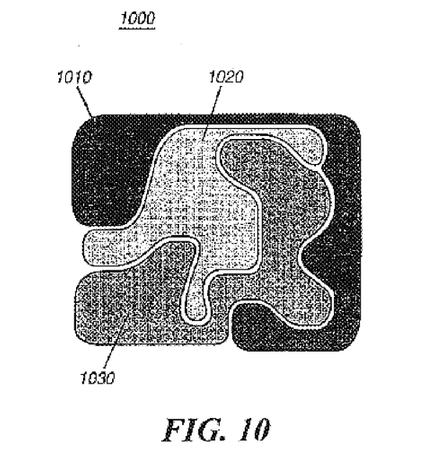
FIG. 10 is a sample grid layout after applying several iterations of the contour solver of the second method for power plane splitting, according to certain embodiments of the present invention.

Referring now to FIG. 10, a sample grid layout after applying several iterations of the potential solver of the second method 1000 for power plane splitting is shown, according to certain embodiments of the present invention. The second method, illustrated in the flowchart of FIG. 2, has been iterated in order to attain three distinct non-shorting regions (1010, 1020, and 1030). Note that in this example, the power plane has been filled out so that the first nodes 810, the second nodes 820, and the third nodes 830 are non-shorting and the three distinct non-shorting regions (1010, 1020, and 1030) have large respective conductive areas. It is noted that a user may further verify that a trace corresponding to a boundary created using the first method or the second method has a sufficient width and a sufficient resistance to meet design requirements. The verification of the trace may be done graphically using a plot substantially similar to the sample grid layout illustrated in FIG. 10.

Certain embodiments of power plane splitting may be applied to printed circuit boards (PCBs), or to any electronic circuit fabrication technology in which multiple power supplies are connected to multiple components. It is further noted that the one or more components may be grouped according to values of power supplies that supply the one or more components.

Those of ordinary skill in the art will recognize that the present invention has been described in terms of exemplary method embodiments and that these embodiments may be implemented by means of computer-readable media tangibly embodying a program of instructions executable by a computer or programmed processor, as well as hardware equivalent components such as special purpose hardware and/or dedicated processors. Similarly, general purpose computers, microprocessor based computers, micro-controllers, optical computers, analog computers, dedicated processors and/or dedicated hard wired logic may be used to construct alternative equivalent embodiments of the present invention. Such alternatives should be considered equivalents.

The present invention may be implemented using one or more programmed processor executing programming instructions that are broadly described above in flow chart form and which can be stored in any suitable electronic storage medium. However, those skilled in the art will appreciate that the processes described above can be implemented in any number of variations and in many suitable programming languages without departing from the present invention. Thus, the process can be described by a set of instructions implementing the processes described and stored on a computer storage medium such as a magnetic disc, optical disc, magneto-optical disc, semiconductor memory, etc. Many such variations and modifications are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:
1. A method for power plane splitting, comprising:
   calculating a potential field of a power plane of a printed circuit board, by assigning one or more potential values to one or more components coupled to the printed circuit board and solving for a plurality of potential field values at a plurality of locations between the one or more components;

defining one or more boundaries between the one or more components by selecting contours of constant potential within the calculated potential field; and creating one or more traces on the power plane using the one or more boundaries, wherein the one or more traces connect a corresponding one or more pluralities of components and each plurality of components of the one or more pluralities of components is coupled to a same power supply.

2. The method of claim 1, further comprising assigning a fixed potential value to the one or more boundaries and re-calculating the potential field of the power plane.

3. The method of claim 1, wherein a user verifies a minimum trace width of the one or more traces.

4. The method of claim 1, wherein a boundary of the power plane has a potential value of zero.

5. The method of claim 1, wherein a potential value of the one or more potential values of the one or more components corresponds to a voltage of a component of the one or more components.

6. The method of claim 1, wherein the one or more boundaries are selected by using contours having a potential value substantially intermediate to a potential value of a first component and a potential value of a second component.

7. The method of claim 1, wherein defining the one or more boundaries further comprises computing a gradient of the calculated potential field and using one or more gradient values to determine if two components have a same potential value.

8. The method of claim 1, wherein the plurality of values of potential corresponding to the plurality of locations are operable to be displayed graphically, thereby enabling a user to adjust a location of the one or more boundaries.

9. The method of claim 1, wherein the one or more boundaries are identified using a plurality of contours, each contour being defined as a subset of the one or more locations having a same potential value.

10. The method of claim 1, wherein a gradient of the plurality of values of potential corresponding to the plurality of locations is operable to indicate if a first component has a same potential value as a second component.

11. The method of claim 10, wherein the indication that the first component has the same potential value as the second component is operable to prevent shorting the one or more traces.

12. A method for automated printed circuit board (PCB) power plane splitting, comprising:

calculating a potential field of a power plane of a printed circuit board by assigning one or more potential values to one or more components coupled to the printed circuit board and solving for a plurality of potential field values at a plurality of locations between the one or more components;

defining one or more boundaries between the one or more components using contours of constant potential within the calculated potential field;

assigning a fixed potential value to the one or more boundaries; and iteratively calculating an updated potential field using the one or more potential values of the one or more components and the fixed potential value of the one or more boundaries, wherein the updated field is operable to be used to further refine a location of the one or more boundaries.

13. The method of claim 12, wherein the fixed potential value is zero.

14. The method of claim 12, wherein a potential value of the one or more potential values of the one or more components corresponds to a voltage of a component of the one or more components.

15. The method of claim 12, wherein the plurality of values of potential corresponding to the plurality of locations are displayed graphically for a user, thereby allowing a user to create one or more traces from the one or more boundaries.

16. The method of claim 12, wherein defining the one or more boundaries further comprises computing a gradient of the calculated potential field and using one or more gradient values to determine if two components have a same potential value.

17. The method of claim 16, wherein determining if two components have the same potential value may be used to prevent shorting one or more traces derived from the one or more boundaries.

18. A method for printed circuit board (PCB) power plane splitting, comprising:

making one or more initial connections between a first one or more components coupled to a printed circuit board employing an auto routing algorithm;

calculating a potential field of a power plane of the printed circuit board, wherein the potential field is calculated by assigning one or more potential values to a second one or more components coupled to the printed circuit board and solving for a plurality of potential field values at a plurality of locations between the second one or more components;

computing a gradient of the potential field and using the gradient to identify one or more boundaries, wherein said one or more boundaries are operable to divide the second one or more components into one or more groups where each component in a group has a same potential value;

expanding a width of a specific boundary of the one or more boundaries when a corresponding gradient of the specific boundary is substantially close to a minimal value; and iterating the calculation of the potential field, the computation of the gradient, and the expansion of boundary widths until the one or more boundaries have corresponding widths that are sufficient to provide a corresponding one or more voltages to the one or more components.

19. The method of claim 18, wherein the first one or more components are a subset of the second one or more components.

20. The method of claim 18, wherein the minimal value is zero.

21. The method of claim 18, wherein substantially close is defined as having two adjacent nodes within 100 $\Delta V$ Volts/mil.

22. The method of claim 18, wherein the one or more boundaries are assigned a fixed potential value.

23. The method of claim 18, wherein a user verifies a minimum trace width of the one or more boundaries.

24. The method of claim 18, wherein a potential value of the one or more potential values of the one or more components corresponds to a voltage of a component of the one or more components.

25. The method of claim 18, wherein the one or more boundaries are selected by using contours having a potential value substantially intermediate to a first component potential value and a second component potential value.

26. A method for power plane splitting, comprising:

dividing a plurality of components coupled to a printed circuit board (PCB) into one or more groups corresponding to one or more power supplies, wherein each component of a group is supplied by a same power supply;

associating with each group of the one or more groups a specific value of potential, wherein a plurality of locations on the PCB not corresponding to an element of any group of the one or more groups comprise a corresponding plurality of values of potential, said corresponding plurality of values of potential being undetermined;

calculating the plurality of values of potential corresponding to the plurality of locations using a potential solver; and creating one or more traces connecting the plurality of components using the plurality of values of potential, wherein any two components belonging to different groups of the one or more groups are connected to different traces.

27. The method of claim 26, further comprising calculating an updated potential field using the one or more potential values of the one or more groups and a fixed potential of a one or more boundaries between the one or more groups, wherein the updated field is operable to be used to refine a location of the one or more boundaries.

28. The method of claim 26, wherein a potential value of a group corresponds to a voltage of any component of the group.

29. The method of claim 26, further comprising identifying one or more boundaries of the one or more groups.

30. The method of claim 29, wherein the one or more boundaries are identified using contours, each contour being defined as a subset of the one or more locations having a same potential value.

31. The method of claim 26, wherein a gradient of the plurality of values of potential corresponding to the plurality of locations is operable to indicate if one or more members of one or more groups belong to a same group.

32. The method of claim 31, wherein the indication that one or more members belong to the same group may be used to prevent shorting one or more members belonging to different groups.

33. Computer-readable media tangibly embodying a program of instructions executable by a computer to perform a method for power plane splitting, the method comprising:

calculating a potential field of a power plane of a printed circuit board, by assigning one or more potential values to one or more components coupled to the printed circuit board and solving for a plurality of potential field values at a plurality of locations between the one or more components;

defining one or more boundaries between the one or more components by selecting contours of constant potential within the calculated potential field; and creating one or more traces on the power plane using the one or more boundaries, wherein the one or more traces connect a corresponding one or more pluralities of components and each plurality of components of the one or more pluralities of components is coupled to a same power supply.

34. A method for power plane, splitting, comprising:

means for calculating a potential field of a power plane of a printed circuit board, by assigning one or more potential values to one or more components coupled to the printed circuit board and solving for a plurality of potential field values at a plurality of locations between the one or more components;

means for defining one or more boundaries between the one or more components by selecting contours of constant potential within the calculated potential field; and means for creating one or more traces on the power plane using the one or more boundaries, wherein the one or more traces connect a corresponding one or more pluralities of components and each plurality of components of the one or more pluralities of components is coupled to a same power supply.

35. Computer-readable media tangibly embodying a program of instructions executable by a computer to perform a method for printed circuit board (PCB) power plane splitting, the method comprising:

making one or more initial connections between a first one or more components coupled to a printed circuit board employing an auto routing algorithm;

calculating a potential field of a power plane of the printed circuit board, wherein the potential field is calculated by assigning one or more potential values to a second one or more components coupled to the printed circuit board and solving for a plurality of potential field values at a plurality of locations between the second one or more components;

computing a gradient of the potential field and using the gradient to identify one or more boundaries, wherein said one or more boundaries are operable to divide the second one or more components into one or more groups where each component in a group has a same potential value;

expanding a width of a specific boundary of the one or more boundaries when a corresponding gradient of the specific boundary is substantially close to a minimal value; and iterating the calculation of the potential field, the computation of the gradient, and the expansion of boundary widths until the one or more boundaries have corresponding widths that are sufficient to provide a corresponding one or more voltages to the one or more components.

* * * * *